US012619004B2

(12) United States Patent
Ohno et al.

(10) Patent No.: US 12,619,004 B2
(45) Date of Patent: May 5, 2026

(54) RUTILE PHASE TIOX DEPOSITION WITH PREFERRED CRYSTAL ORIENTATIONS

(71) Applicant: Applied Materials, Inc., Santa Clara, CA (US)

(72) Inventors: Kenichi Ohno, Sunnyvale, CA (US); Takashi Kuratomi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 17/936,911

(22) Filed: Sep. 30, 2022

(65) Prior Publication Data

US 2023/0112967 A1 Apr. 13, 2023

Related U.S. Application Data

(60) Provisional application No. 63/270,130, filed on Oct. 21, 2021, provisional application No. 63/255,064, filed on Oct. 13, 2021.

(51) Int. Cl.
| | |
|---|---|
| *G02B 1/02* | (2006.01) |
| *C30B 23/02* | (2006.01) |
| *C30B 28/12* | (2006.01) |
| *C30B 29/16* | (2006.01) |
| *H01J 37/34* | (2006.01) |

(52) U.S. Cl.
CPC ............... *G02B 1/02* (2013.01); *C30B 23/02* (2013.01); *C30B 28/12* (2013.01); *C30B 29/16* (2013.01); *H01J 37/3405* (2013.01); *H01J 2237/332* (2013.01)

(58) Field of Classification Search
CPC ...................................................... B41M 3/003
See application file for complete search history.

(56) References Cited

U.S. PATENT DOCUMENTS

| | | | | |
|---|---|---|---|---|
| 5,944,964 | A | 8/1999 | Solberg et al. | |
| 9,052,456 | B2 | 6/2015 | Hassan et al. | |
| 11,789,284 | B2 * | 10/2023 | Thomas ............. | G02B 27/0172 |
| | | | | 359/629 |
| 12,072,543 | B1 * | 8/2024 | Rivera ................. | G02B 6/4295 |
| 12,242,057 | B2 * | 3/2025 | Damm ............... | G02B 27/0172 |
| 12,253,652 | B2 * | 3/2025 | De Vita .................. | G02B 1/14 |
| 12,345,872 | B2 * | 7/2025 | Yun ..................... | G02B 27/0025 |
| 2004/0258947 | A1 | 12/2004 | Moelle et al. | |
| 2006/0257669 | A1 | 11/2006 | Ritz et al. | |

(Continued)

FOREIGN PATENT DOCUMENTS

| | | | | |
|---|---|---|---|---|
| JP | 2009 067648 A | 4/2009 | | |
| WO | WO-2025067841 A1 * | 4/2025 | ....... | B29D 11/00326 |

OTHER PUBLICATIONS

Drogowska, K. et al., "RBS, XRR and optical reflectivity measurements of Ti-TiO2 thin films deposited by magnetron sputtering", Materials Research Bulletin, 2012, vol. 47, No. 2, pp. 296-301 abstracts; pp. 296-299; table 2.

(Continued)

*Primary Examiner* — Christopher P Ellis
(74) *Attorney, Agent, or Firm* — Patterson + Sheridan, LLP

(57) ABSTRACT

Embodiments of the present disclosure generally relate to optical devices. More specifically, embodiments described herein relate to an optical device layer stack, an optical device formed from the optical device layer stack, and a method of forming an optical device layer stack.

20 Claims, 4 Drawing Sheets

(56)                References Cited

U.S. PATENT DOCUMENTS

| 2022/0204790 | A1* | 6/2022 | Zhang | .................. | G02B 5/1814 |
|---|---|---|---|---|---|
| 2024/0001700 | A1* | 1/2024 | Luo | ..................... | B41J 11/0021 |

OTHER PUBLICATIONS

PCT Notification of Transmittal of the International Search Report and the Written Opinion of the International Searching Authority for International Application No. PCT/US2022/045343; dated Feb. 1, 2023.

Extended European Search Report for Application No. 22881566.8 dated Feb. 26, 2026.

Nechache R et al: "Pulsed Laser Deposition Growth of Rutile TiO2nanowires on Silicon Substrates", Applied Surface Science, vol. 313, (May 27, 2014), pp. 48-52, XP029039179, DOI:10.1016/J.APSUSC.2014.05.123, p. 49, figure 2.

Selman Abbas M et al: "Influence of Deposition Temperature on the Growth of Rutile TiO2nanostructures by CBD Method on Seed Layer Prepared by RF Magnetron Sputtering", Superlattices and Microstructures, vol. 64, Dec. 31, 2013 (Dec. 31, 2013), pp. 27-36, XP028778025, ISSN: 0749-6036, DOI: 10.1016/J.SPMI.2013.09. 018, pp. 28-35, table 1.

Escaliante Lucas Caniati et al:"Multilayered TiO2/TiO2-x/TiO2 Films Deposited by Reactive Sputtering for Photocatalytic Applications", Journal of Materials Research, vol. 36, No. 15,(Jul. 23, 2021), pp. 3096-3108, XP093362635, US ISSN: 0884-2914, DOI:10. 1557/s43578-021-00310-6 URL:https://link.springer.com/article/10. 1557/s43578-021-00310-6/fulltext.html> p. 3102, p. 3104,table 2.

* cited by examiner

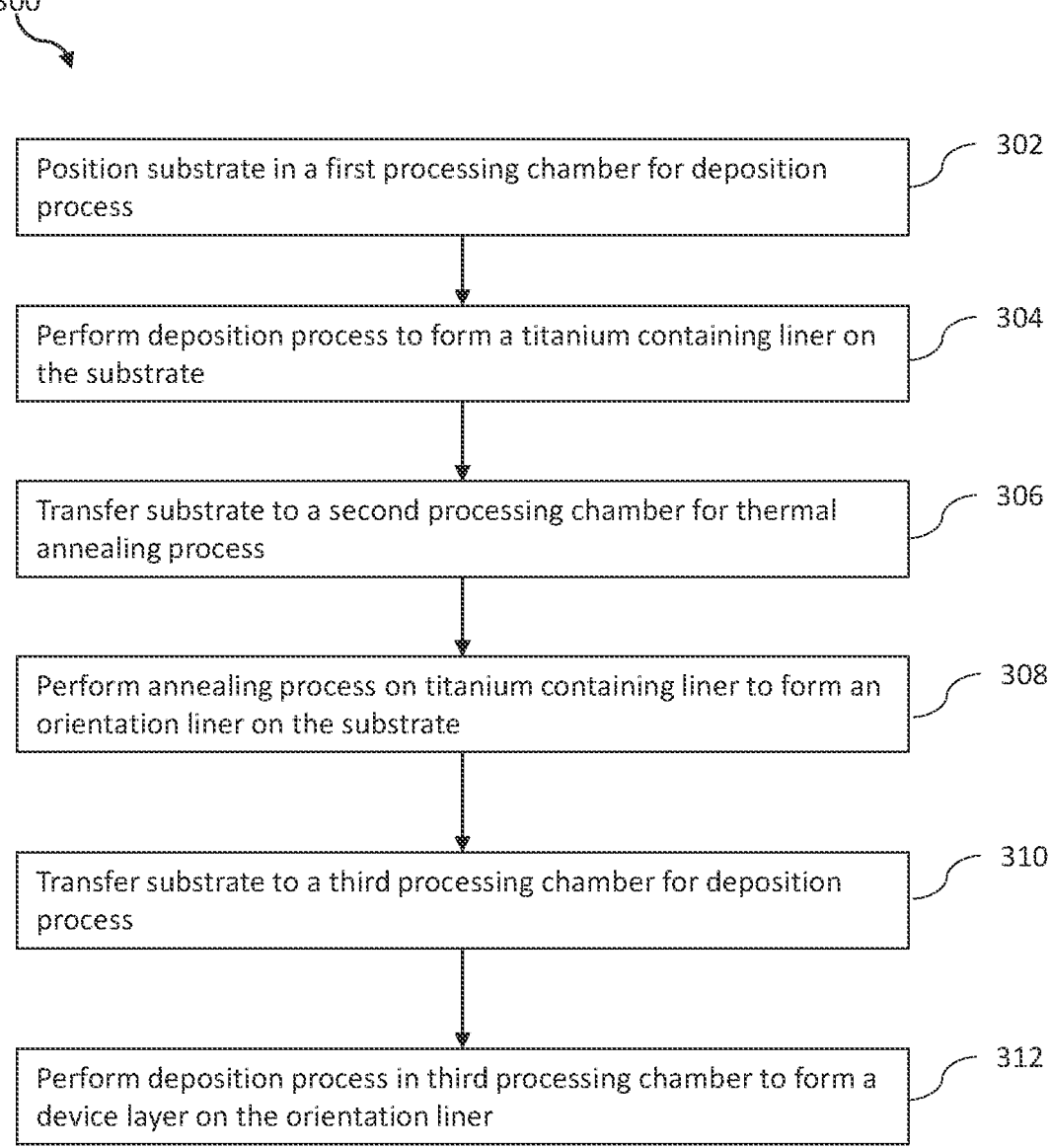

300

302 — Position substrate in a first processing chamber for deposition process

304 — Perform deposition process to form a titanium containing liner on the substrate 306 — Transfer substrate to a second processing chamber for thermal annealing process 308 — Perform annealing process on titanium containing liner to form an orientation liner on the substrate 310 — Transfer substrate to a third processing chamber for deposition process 312 — Perform deposition process in third processing chamber to form a device layer on the orientation liner

FIG. 3

RUTILE PHASE TIOX DEPOSITION WITH PREFERRED CRYSTAL ORIENTATIONS

RELATED APPLICATIONS

This application claims benefit of and priority to U.S. Provisional Application No. 63/255,064 filed Oct. 13, 2021, and U.S. Provisional Application No. 63/270,130, filed Oct. 21, 2021, which are herein incorporated in their entirety by reference for all purposes.

BACKGROUND

Field

Embodiments of the present disclosure generally relate to optical devices. More specifically, embodiments described herein relate to an optical device layer stack, an optical device formed from the optical device layer stack, and a method of forming an optical device layer stack.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated to appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlaid on an ambient environment. Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment.

Accordingly, what is needed in the art is an optical device film, an optical device layer stack, an optical device formed from the optical device layer stack, and a method of forming an optical device layer stack.

SUMMARY

In one embodiment, a method for forming an optical device layer stack is provided. The method includes depositing a titanium containing layer on a substrate and thermally treating the titanium containing layer to form an orientation liner on the substrate. Then, an optical device layer of titanium oxide is deposited over the orientation liner. A rutile phase titanium oxide makes up about 100 percent of the optical device layer deposited on the orientation liner.

In another embodiment, an optical device layer stack is provided. The optical device layer stack includes a substrate having a first surface and an orientation liner disposed over the first surface of the substrate. The optical device layer stack also includes an optical device layer disposed over the orientation liner. The orientation liner is formed of a titanium containing material and the optical device layer is formed of titanium oxide selected from the group consisting of titanium(IV) oxide (TiO2), titanium monoxide (TiO), dititanium trioxide (Ti2O3), Ti3O, Ti2O, $\delta$-TiOx, where x is 0.68 to 0.75, and TinO2n−1, where n is 3 to 9. A rutile phase of the titanium oxide is about 100 percent of the optical device layer.

In yet another embodiment, an optical device is provided. The optical device includes a substrate having a first surface and a plurality of optical device structures disposed over the first surface of the optical device substrate. The plurality of optical device structures on the substrate are spaced apart from one another in a direction parallel to the first surface of the substrate. Each of the plurality of optical device structures is formed from an orientation liner and an optical device layer disposed on the substrate. The orientation liner in each of the optical device structure is formed of a titanium containing material and the optical device layer is formed of titanium oxide. The titanium oxide in the optical device layer is selected from the group consisting of titanium oxide titanium(IV) oxide ($TiO_2$), titanium monoxide (TiO), dititanium trioxide ($Ti_2O_3$), $Ti_3O$, $Ti_2O$, $\delta$-$TiO_x$, where x is 0.68 to 0.75, and $Ti_nO_{2n-1}$, where n is 3 to 9. A rutile phase of the titanium oxide is about 100 percent of the optical device layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3 is a flow diagram of an example method of forming an optical device layer stack on a substrate, according to certain embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein relate to an optical device layer stack, an optical device formed from the optical device layer stack, and a method of forming an optical device layer stack. Please find appendix attached.

Figure 1:
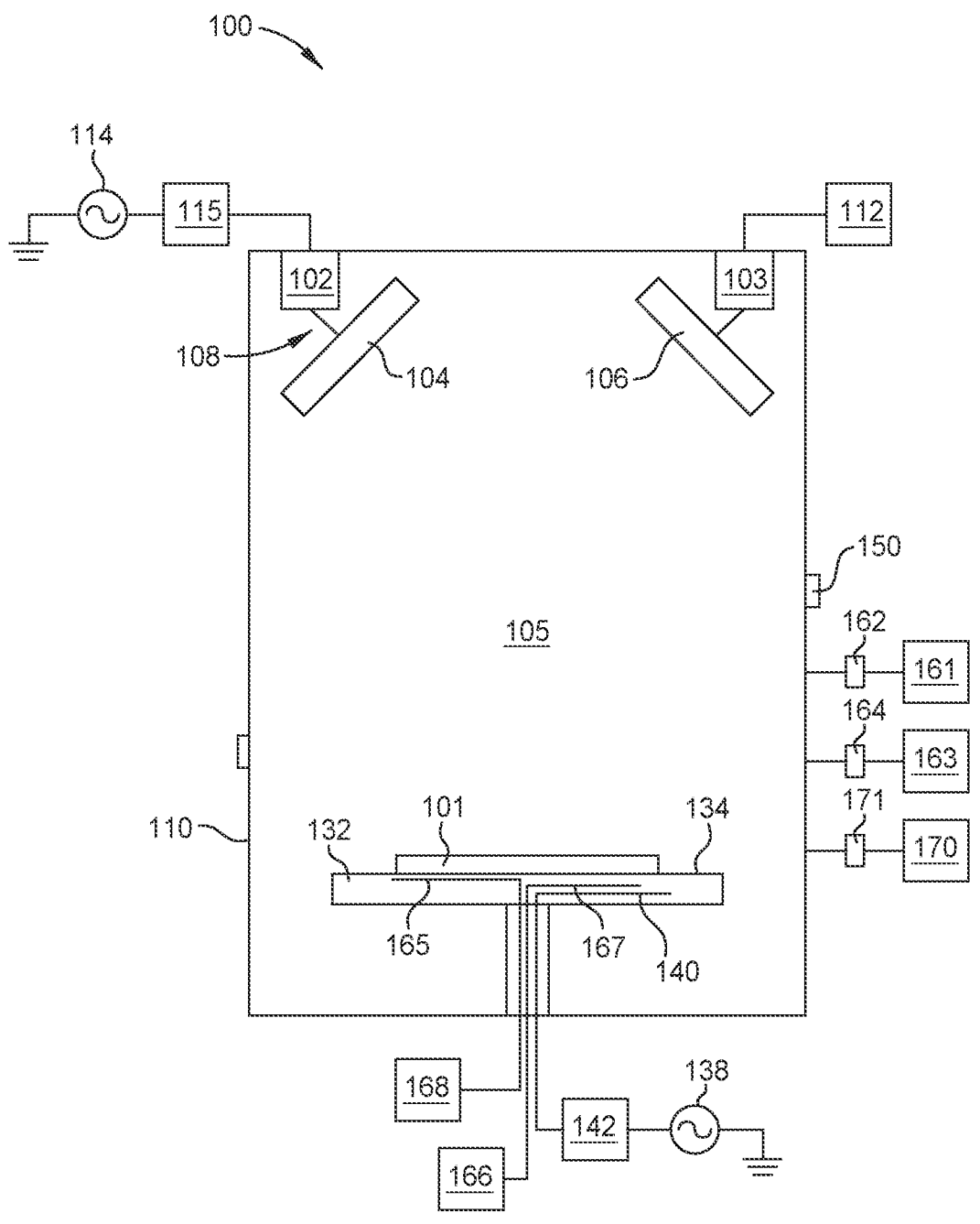
FIG. 1 is a schematic, cross-sectional view of an example processing chamber that may be utilized to perform a physical vapor deposition (PVD) processing process, according to certain embodiments described herein.

FIG. 1 is a schematic cross-sectional view of a processing chamber 100 according to one embodiment described herein. The processing chamber 100 may be a deposition chamber, such as a PVD chamber. The processing chamber 100 may be used to perform the methods described herein and configured at least to deposit a thin film on a substrate 101. It is to be understood that the chamber 100 is an exemplary physical vapor deposition (PVD) chamber and other PVD chambers, including PVD chambers from other manufacturers, may be used with or modified to accomplish the methods of the present disclosure. While PVD is discussed in this disclosure, various deposition techniques, such as chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc., are also contemplated.

The processing chamber 100 includes one or more cathodes 102, 103 that have a corresponding single target or a plurality of targets, attached to the chamber body 110 (e.g., via a chamber body adapter). Although the example PVD chamber 100 depicted in FIG. 1 and discussed herein is a multi-cathode PVD chamber, a pulsed direct current PVD chamber with a single target may alternatively also be used to perform the methods herein. In the implementation shown in FIG. 1, the processing chamber 100 includes at least one first target 104 and at least one second target 106. The first target 104 includes at least one first material and the second target 106 includes at least one second material. While FIG. 1 depicts one first target 104 and one second target 106, the processing chamber 100 may include only a single target, one or more first targets 104, and/or one or more second targets 106. Each cathode (e.g., the first target 104 and second target 106) may be coupled to a DC power source 112 and/or an RF power source 114 and matching network 116.

The processing chamber 100 is configured to include a substrate support 132 having a support surface 134 to support the substrate 101. The processing chamber 100 includes an opening 150 (e.g., a slit valve) through which an end effector (not shown) extends to place a substrate 101 onto lift pins (not shown) for lowering the substrate 101 onto the support surface 134.

The processing chamber 100 includes a sputter gas source 161 operable to supply a sputter gas to a process volume 105. A plasma 198 can be generated in the processing volume 105 from a non-reactive sputter gas (such as argon (Ar), krypton (Kr), etc., and/or from a process gas including an oxygen-containing gas (e.g., O2) for oxide deposition, according to some embodiments. The present disclosure contemplates that other sputter gas(es) may also be used.

A gas flow controller 162 is disposed between the sputter gas source 161 and the process volume 105 to control a flow of the sputter gas from the sputter gas source 161 to the process volume 105. The processing chamber 100 also includes a reactive gas source 163 operable to supply a reactive gas, such as an oxygen-containing gas or nitrogen-containing gas to the process volume 105. A gas flow controller 164 is disposed between the reactive gas source 163 and the process volume 105 to control a flow of the reactive gas from the reactive gas source 163 to the process volume 105. The processing chamber 100 may include a precursor gas source 170 operable to supply a precursor gas to the process volume 105. In one embodiment, which can be combined with other embodiments, a gas flow controller 171 is disposed between the precursor gas source 170 and the process volume 105 to control a flow of the precursor gas from the precursor gas source 170 to the process volume 105. Sputter gases, reactive gases, and precursor gases may each be referred to as process gases herein. During processing, the process volume 105 can be maintained at a process pressure using a vacuum device and/or the gas flow controllers 162, 164, 171.

The substrate support 132 includes an RF bias power source 138 coupled to a bias electrode 140 disposed in the substrate support 132 via a matching network 142. The substrate support 132 includes a mechanism (not shown) that retains the substrate 101 on the support surface 134 of the substrate support 132, such as an electrostatic chuck, a vacuum chuck, a substrate retaining clamp, or the like. The substrate support 132 includes a cooling conduit 165 disposed in the substrate support 132 where the cooling conduit 165 controllably cools the substrate support 132 and the substrate 101 positioned thereon to a predetermined temperature, for example between about −20° C. to about 300° C. The cooling conduit 165 is coupled to a cooling fluid source 168 to provide cooling fluid (not shown). The substrate support 132 also includes a heater 167 embedded therein. The heater 167, such as a resistive element, disposed in the substrate support 132 is coupled to an optional heater power source 166 and controllably heats the substrate support 132 and the substrate 101 positioned thereon to a predetermined temperature, for example between about −150° C. to about 500° C.

Figure 2:
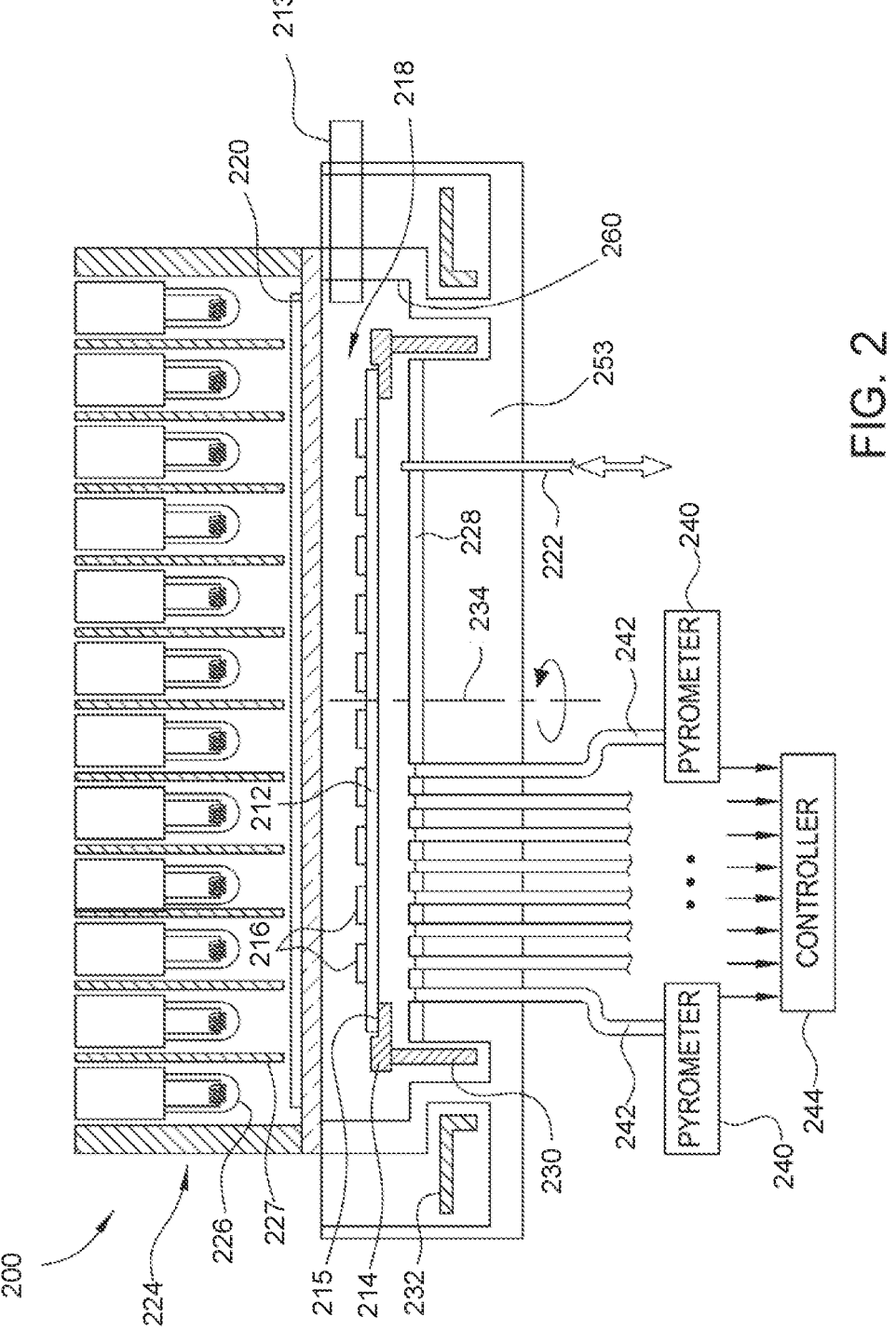
FIG. 2 is a schematic, cross-sectional view of an example processing chamber that may be utilized to perform a thermal annealing processing process, according to certain embodiments described herein.

FIG. 2 is a schematic cross-sectional view of a processing chamber 200, according to certain embodiments of the disclosure. In the example shown, the processing chamber 200 may be a rapid thermal processing (RTP) chamber. Examples of a suitable RTP chamber may include RADIANCE® RTP or CENTURA® RTP chamber, available from Applied Materials, Inc., Santa Clara, California. While the processing chamber 200 shows a top heating configuration (i.e., heating lamps provided relatively above the substrate), it is contemplated that a bottom heating configuration (i.e., heating lamps provided relatively below the substrate) may also be utilized to benefit from the present disclosure. A substrate 212, for example, a semiconductor substrate such as a silicon substrate, to be thermally processed is passed through the valve or access port 213 into the process area 218 of the processing chamber 200. The substrate 212 is supported on its periphery by an annular support ring 214. An edge lip 215 extends inward of the annular support ring 214 and contacts a portion of the backside of the substrate 212. The substrate may be oriented such that processed features 216 already formed in a front surface of the substrate 212 face upwardly toward a process area 218 defined on its upper side by a transparent quartz window 220. The front surface of the substrate 212 is facing toward the array of lamps 226. In some embodiments, the front surface of the substrate 212 with the processed featured formed thereon may face away from the array of lamps 226, i.e., facing towards the pyrometers 240. Contrary to the schematic illustration, the features 216 for the most part do not project substantial distances beyond the front surface of the substrate 212 but constitute patterning within and near the plane of the front surface.

A plurality of lift pins 222, such as three lift pins, may be raised and lowered to support the back side of the substrate 212 when the substrate is handed between a paddle or robot blade (not shown) bringing the substrate into the processing chamber and onto the support ring 214. A radiant heating apparatus 224 is positioned above the window 220 and configured to direct radiant energy toward the substrate 212 through the window 220. In the processing chamber 200, the radiant heating apparatus may include a large number, 2409 being an exemplary number, of high-intensity tungsten-halogen lamps 226 positioned in respective reflective tubes 227 arranged in a hexagonal close-packed array above the window 220. The array of lamps 226 is sometimes referred to as the lamphead. However, it is contemplated that other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that emits radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical ramp-down (cooling) rates in RTP chambers are in the range of about 80° C./second to 150° C./second. Some processes performed in RTP chambers require variations in temperature across the substrate of less than a few degrees Celsius. Thus, an RTP chamber must include a lamp or other suitable heating system and heating system control capable of heating at rate of up to about 100° C./second to 150° C./second, and about 200° C./second to 400° C./second, distinguishing rapid thermal processing chambers from other types of thermal chambers that do not have a heating system and heating control system capable of rapidly heating at these rates. An RTP chamber with such a heating control system may anneal a sample in less than 5 seconds, for example, less than 1 second, and in some embodiments, milliseconds.

It is important to control the temperature across the substrate 212 to a closely defined temperature uniform across the substrate 212. One passive means of improving the uniformity may include a reflector 228 disposed beneath the substrate 212. The reflector 228 extends parallel to and over an area greater than the substrate 212. The reflector 228 efficiently reflects heat radiation emitted from the substrate 212 back toward the substrate 212 to enhance the apparent emissivity of the substrate 212. The spacing between substrate 212 and the reflector 228 may be between about 3 mm to 9 mm, and the aspect ratio of the width to the thickness of the cavity is advantageously greater than 220. The top of reflector 228, which may be made of aluminum and has a highly reflective surface coating or multi-layer dielectric interference mirror, and the back side of the substrate 212 form a reflecting cavity for enhancing the effective emissivity of the substrate, thereby improving the accuracy of temperature measurement. In certain embodiments, the reflector 228 may have a more irregular surface or have a black or other colored surface to more closely resemble a black-body wall. The reflector 228 may be deposited on a second wall 253, which is a water-cooled base made of metal to heat sink excess radiation from the substrate, especially during cool down. Accordingly, the process area of the processing chamber 200 has at least two substantially parallel walls, of which a first is a window 220, made of a material being transparent to radiation such as quartz, and the second wall 253 which is substantially parallel to the first wall and made of metal significantly not transparent.

In an embodiment, the support ring 214 is supported on a rotatable support cylinder 230 that is disposed radially inward of the inner circumferential surfaces 260 of the processing chamber 200. The support cylinder 230 is magnetically coupled to a rotatable flange 232 positioned outside the processing chamber 200. A motor (not shown) rotates the flange 232 and hence rotates the substrate about its center, which is also the centerline of the generally symmetric chamber. Alternatively, the bottom of the support cylinder 230 may be magnetically levitated cylinder held in place by magnets disposed in the rotatable flange 232 and rotated by rotating magnetic field in the rotatable flange 232 from coils in the rotatable flange 232.

In another embodiment, the lamps 226 are divided into zones and arranged generally ring-like about the central axis 234. Control circuitry varies the voltage delivered to the lamps 226 in the different zones to thereby tailor the radial distribution of radiant energy. Dynamic control of the zoned heating is affected by, one or a plurality of pyrometers 240 coupled through one or more optical light pipes 242 positioned to face the back side of the substrate 212 through apertures in the reflector 228 to measure the temperature across a radius of the rotating substrate 212. The light pipes 242 may be formed of various structures including sapphire, metal, and silica fiber. A computerized controller 244 receives the outputs of the pyrometers 240 and accordingly controls the voltages supplied to the different rings of lamps 226 to thereby dynamically control the radiant heating intensity and pattern during the processing. Pyrometers generally measure light intensity in a narrow wavelength bandwidth of, for example, 40 nm in a range between about 700 to 1000 nm. The controller 244 or other instrumentation converts the light intensity to a temperature through the well-known Planck distribution of the spectral distribution of light intensity radiating from a black-body held at that temperature. Pyrometry, however, is affected by the emissivity of the portion of the substrate 212 being scanned. Emissivity e can vary between 1 for a black body to 0 for a perfect reflector and thus is an inverse measure of the reflectivity $R=1-\varepsilon$ of the substrate back side. While the back surface of a substrate is typically uniform so that uniform emissivity is expected, the backside composition may vary depending upon prior processing. The pyrometry can be improved by further including a emissometer to optically probe the substrate to measure the emissivity or reflectance of the portion of the substrate it is facing in the relevant wavelength range and the control algorithm within the controller 244 to include the measured emissivity.

FIG. 3 is a flow diagram of a method 300 for forming an optical device layer stack on a substrate, according to certain embodiments described herein. One or more optical devices may then be formed from the optical device layer stack. Exemplary optical devices which may be formed using embodiments described herein include waveguide combiners, such as an augmented reality waveguide combiner, and flat optical devices, such as metasurfaces.

Figures 4A, 4B, 4C, 5:
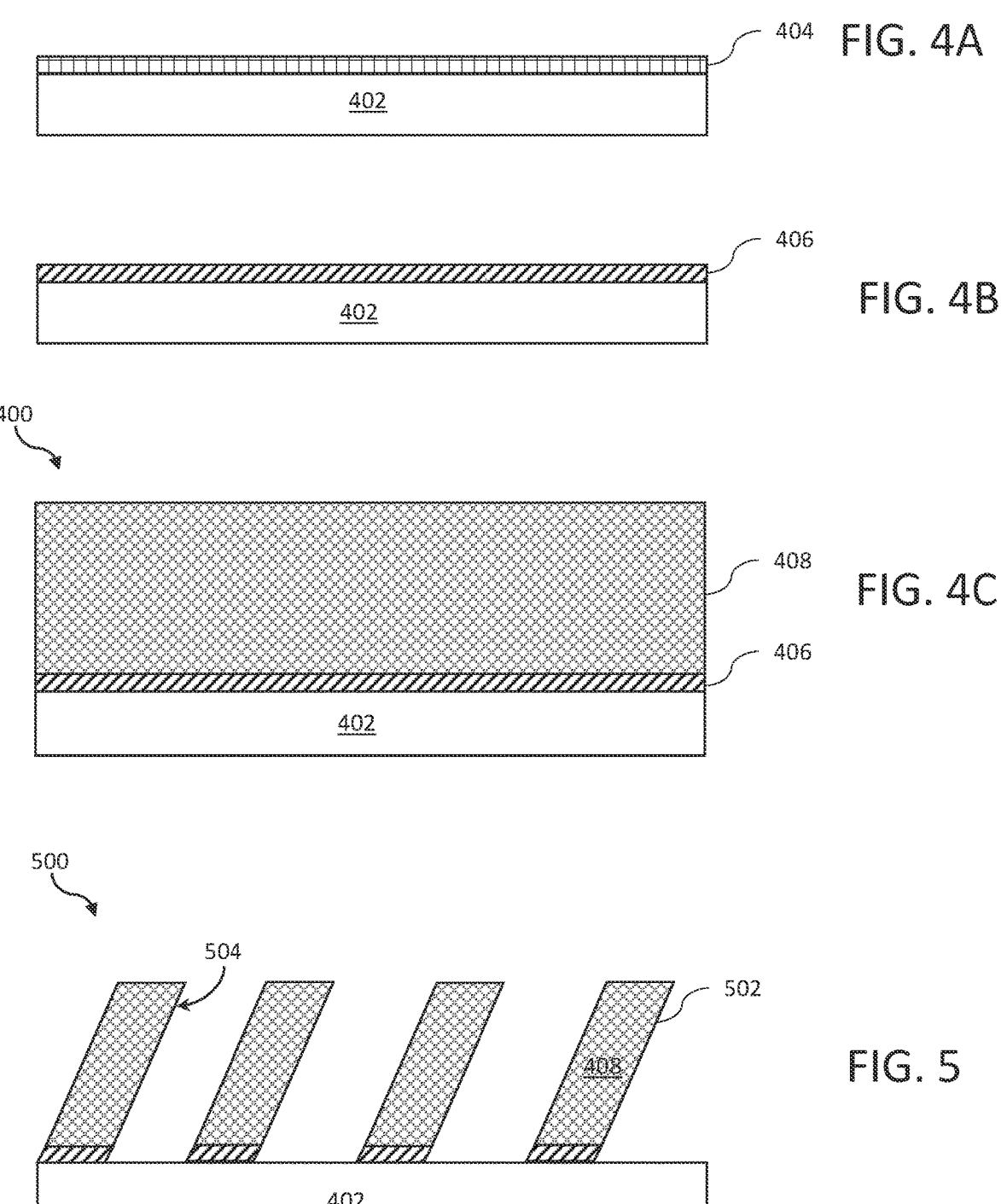
FIGS. 4A-4C are schematic, cross-sectional views of an optical device layer stack formed on a substrate utilizing the method shown in FIG. 3, according to certain embodiments described herein.
FIG. 5 is a schematic, cross-sectional view of an optical device, according to certain embodiments described herein.

FIGS. 4A-4C are cross-sectional views of an optical device stack 400 formed therein on a substrate 402 utilizing the method shown in FIG. 3, according to certain embodiments. The optical device stack 400 includes an orientation liner 406 formed on the substrate 402, and a device layer 408 formed on the orientation liner 406. In one embodiment, the optical device stack 400 is utilized to form one or more optical devices on the substrate 402.

Method 300 begins at operation 302 where a substrate, such as the substrate 402 depicted in FIG. 4, is positioned into a first processing chamber, such as the processing chamber 100 depicted in FIG. 1, or other suitable processing chamber for a deposition process. In an embodiment, the substrate 402 may have a substantially planar surface, an uneven surface, or a substantially planar surfacing having a structure formed thereon. The substrate 402 may be any suitable optical device substrate. The substrate 402 may be any suitable material, provided that the substrate 402 can adequately transmit light in a desired wavelength or wavelength range and can serve as an adequate support for the optical device stack 400. In an embodiment, which can be combined with other embodiments herein, the substrate 402 is made from material including but not limited to silicon, silicon dioxide, silicon carbide, silica (e.g., fused silica), sapphire, glass having a refractive index greater than 2.0, diamond, lanthanum aluminate, magnesium oxide, gallium nitride, gallium oxide, or combinations thereof. The substrate 402 may have various dimensions, such as 200 mm or 300 mm diameter wafers, as well as rectangular or square panels.

At operation 304, a titanium containing liner 404 is formed on the substrate 402, as shown in FIG. 4A. In an embodiment, the titanium containing liner 404 includes material from the group consisting of pure titanium (Ti), titanium(IV) oxide ($TiO_2$), titanium monoxide (TiO), dititanium trioxide ($Ti_2O_3$), $Ti_3O$, $Ti_2O$, b-$TiO_x$, where x is 0.68 to 0.75, and $Ti_nO_{2n-1}$, where n is 3 to 9. Examples of $Ti_nO_{2n-1}$ include $Ti_3O_5$ and $Ti_4O_7$. The titanium liner 402 has a liner thickness of about 20 nanometers (nm) or less, such as less than about 10 nm, e.g., 5 nm.

During operation 304, in an example, the titanium containing liner 404 may be a pure titanium layer deposited on the substrate 402 by performing a typical PVD process in a processing chamber, such as the processing chamber 100. Although the method operations are described in conjunction with FIG. 3, persons skilled in the art will understand that any system configured to perform the method operations, in any order, falls within the scope of the embodiments described herein. While PVD is discussed in this disclosure, various deposition techniques, such as chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), electron-beam evaporation, thermal evaporation, etc., are also contemplated.

In operation 304, the titanium containing liner 404 can be deposited by using the RF power source 114 coupled to the sputter target 104 in the PVD processing chamber 100. The sputter target 104 can include titanium. A plasma can be generated from a non-reactive gas such as argon (Ar), krypton (Kr), etc., and from a process gas including an oxygen-containing gas (e.g., O2) for oxide deposition, according to some embodiments. In an embodiment, non-reactive pure Ar gas is used to deposit the titanium containing liner 404 as pure titanium. The non-reactive gas and any processing gas can be introduced into the deposition chamber via gas conduits disposed at the sidewall and/or top of the deposition chamber. A gas source is in fluid communication with the gas conduits, such that the gas source supplies the process gas to the sputter target, according to one embodiment. Once the plasma is formed, the sputtering plasma is delivered to the sputter target 104 to form an ionized species, the ionized species forming a titanium-containing layer (e.g., the titanium containing liner 404) on the substrate 402. The RF power can be applied to the sputter target at a power level from about 1 kW to about 10 kW, such as about 5 kW, according to one embodiment.

In one embodiment, which can be combined with other embodiments described herein, the frequency of the RF power can be in a range of about 10 MHz to about 30 MHz, for example, about 13.56 MHz. In another embodiment, the process pressure in the processing volume is less than or equal to 50 mTorr, such as less than or equal to 20 mTorr, such as less than or equal to 10 mTorr (e.g., between 1 mTorr and 10 mTorr). In some embodiments, an auto capacitance tuner (ACT) (not shown) connected to the PVD chamber 100 can be used and adjusted to control the bias of the substrate support during the deposition, which can assist in obtaining a consistent flow of deposition material towards the substrate 402.

Additionally or alternatively, in another embodiment, if the sputter target 106 is used, the DC power supply 112 coupled to the sputter target 106 of the PVD processing chamber can be used to ignite and maintain the plasma of the processing gas (e.g., inert gas or an oxygen-containing gas for oxide deposition) for the deposition of the titanium containing liner 404. The processing gas is energized to ignite a plasma producing positive ions that are accelerated to the sputter target (e.g., silicon sputter target) and sputter the sputter target material. In one embodiment, DC power can be provided from the DC power supply 112 to the target 106 at a power level 1 kW to about 10 kW, such as about 5 kW. In embodiments where both RF and DC power are used, a ratio of applied RF power to applied DC power can be about 2:1 to about 8:1, for example, about 4:1 to about 6:1, according to some embodiments. In some embodiments, the sputter target can be biased with pulsed DC power to tune the stress level of the backside film layer. In such an embodiment, a high power impulse magnetron sputtering process can be performed to ignite and maintain the plasma which provides for sputtering and etching phases of the waveform.

At operation 306, the substrate 402 with the titanium containing liner 404 deposited thereon is transferred into a second processing chamber, such as the thermal annealing processing chamber 200 depicted in FIG. 2. Alternatively, the annealing process may be performed in any processing chamber configured to provide enough thermal energy to the substrate 402 and the titanium containing liner 404. In operation 308, a thermal annealing process is performed on the substrate 402 and the titanium containing liner 404 to form an orientation liner 406 on the substrate 402, as shown in FIG. 4B. The thermal annealing process is performed to repair, densify and enhance lattice structures of the titanium containing liner 404, thus crystalizing and/or enhancing the crystallinity of the liner 404.

The thermal annealing process in operation 308 may heat the titanium containing liner 404 to an annealing temperature greater than 400 degrees Celsius, such as between about 400 degrees Celsius and about 1500 degree Celsius, for example between about 800 degrees Celsius and about 1200 degrees Celsius, such as about 900 degrees Celsius. During the annealing process, an annealing gas/air mixture may be supplied to the processing chamber 200. Gases that may be supplied in the annealing gas mixture may include air, $O_2$, $N_2$, Ar, Kr, Xe, $H_2O$, $H_2$, or combinations thereof. The annealing process may occur for an annealing time between about 1 minute to about 72 hours. In an embodiment, the annealing process is about 15 minutes.

After the thermal annealing process, the titanium containing liner 404 may be turned into the orientation liner 406 to provide a growth template for subsequent deposition processes to form the optical device stack 400. The thermal energy provided during the thermal annealing process assists in crystallizing the titanium containing liner 404 from an amorphous state into a crystalline state in cases of a pure titanium layer, or enhances the crystallinity of the titanium containing liner 404 in cases of an oxide layer. The orientation liner 406 formed may be crystalline or polycrystalline. In an embodiment, the orientation liner 406 has a crystal orientation. In another embodiment, the orientation liner 406 includes the crystal orientation of one of (211), (110), (101), (200), (111), (210), (220), (002), (221), (301), (311), (320), (202), (212), (321), (400), or (410). In one example, the crystal orientation of the orientation liner 406 is (211).

In some embodiments, which may be combined with other embodiments described herein, the thermal annealing process performed at operation 308 may be a rapid thermal annealing process, laser annealing process, furnace annealing process or any suitable thermal annealing process as needed.

After the orientation liner 406 is formed on the substrate 402, in operation 310, the substrate 402 with the orientation liner 406 formed thereon is transferred into a deposition processing chamber, such as the first processing chamber 100 depicted in FIG. 1 and utilized in operation 302, for deposition of the device layer 408. Alternatively, other suitable processing chambers capable of a deposition process may be used.

In operation 312, the device layer 408 is deposited on the orientation liner 406, as shown in FIG. 4B. In an embodiment, which can be combined with other embodiments herein, the device layer 408 includes titanium oxide. The titanium oxide is selected from the group consisting of titanium(IV) oxide (TiO₂), titanium monoxide (TiO), dititanium trioxide (Ti₂O₃), Ti₃O, Ti₂O, b-TiOₓ, where x is 0.68 to 0.75, and TiₙO₂ₙ₋₁, where n is 3 to 9. Examples of TiₙO₂ₙ₋₁ include Ti₃O₅ and Ti₄O₇. A rutile phase of the titanium oxide makes up about 100 percent of the device layer 408. The titanium oxide in the device layer 408 may be crystalline or polycrystalline. In an embodiment, the device layer 408 includes the crystal orientation of one of (211), (110), (101), (200), (111), (210), (220), (002), (221), (301), (311), (320), (202), (212), (321), (400), or (410). In one example, the device layer 408 is formed with a crystal orientation preference for (211). In an embodiment, the crystal phase of the device layer 408 may be matched to the orientation liner 406. In one example, the orientation liner 406 and the device layer 408 are crystalline. In another example, the orientation liner 406 and the device layer 408 are polycrystalline. The crystal orientation of the device layer 408 may be matched to the orientation liner 406. In one example, the orientation liner 406 and the device layer 408 have a crystal orientation of (211). In an embodiment, the device layer 408 is formed with a thickness of about 1000 nm or less.

During operation 312, in an example, the device layer 408 is a titanium oxide layer deposited on the orientation liner 406 by performing a PVD process in a PVD processing chamber, such as the processing chamber 100. While PVD is discussed in this disclosure, various deposition techniques, such as chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), electron-beam evaporation, thermal evaporation, etc., are also contemplated.

During the PVD process at operation 312, an oxygen-containing gas (e.g., O2) can be provided to the processing volume 105 from the reactive gas source, and a sputter gas (e.g., argon) can be provided from the sputter gas source. Depending on the target 104, 106 used, power provided to the second target 106 from the DC power supply 112 and/or power provided to the first target 104 from the RF power supply 114 can be used to ignite a plasma in the processing volume 105. Either of the first target 104 coupled to the RF power supply 114 or the second target 106 coupled to the DC power supply 112 can be used to deposit the device layer 408. In some embodiments, the DC power from the DC power supply 112 can be pulsed to generate the plasma. In one embodiment, RF power can be provided from the RF power supply 114 to target 104 at a power level from about 1 kW to about 10 kW, such as about 5 kW, for example at a frequency of 13.56 MHz. In one embodiment, DC power can be provided from the DC power supply 112 to the target 106 at a power level 1 kW to about 10 kW, such as about 5 kW.

During operation 312, in one embodiment, the second target 106 can be a titanium (Ti) target. During the PVD process, the plasma of the sputter gas (e.g., argon) bombard the second target 106 causing titanium atoms to be ejected from the second target 106. The DC power can be used to attract ions and or radicals of the sputter gas as well as electrons to sputter the material from the second target 106. In an embodiment, oxygen atoms react with the titanium atoms on the second target 106 and form titanium oxide. The titanium and oxygen atoms may then be ejected as titanium oxide from the second target 106 and deposited over the orientation liner 406 on the substrate 402. In another embodiment, the reactive gas (e.g., O2) flowed into the processing volume is consumed as part of the deposition of the titanium oxide in the device layer 408.

In one embodiment, which can be combined with other embodiments described herein, the PVD process is operated in a metallic mode causing the second target 106 to not oxidize during the deposition process. In another embodiment, a process pressure in the processing volume 105 is less than or equal to 50 mTorr, such as less than or equal to 20 mTorr, such as less than or equal to 10 mTorr (e.g., between 1 mTorr and 10 mTorr). In some embodiments, an auto capacitance tuner (ACT) (not shown) connected to the PVD chamber 100 can be used and adjusted to control the bias of the substrate support 132 during the deposition, which can assist in obtaining a consistent flow of deposition material towards the substrate 402.

Using aspects described herein, it has been found that the orientation liner 406 formed by the deposition and annealing processes performed in operations 306 and 308 prepare a growth template on the substrate 402 that encourages and forces the titanium oxide of the device layer 408 to be formed in a specific crystal phase and preferred orientation. In an embodiment, the orientation liner 406 therefore encourages and forces about 100 percent of the titanium oxide in the device layer 408 to be rutile phase. In another embodiment, the titanium oxide in the device layer 408 deposited on the orientation liner 406 exhibits a preference for a crystal orientation of (211).

Since rutile phase titanium oxide has a higher refractive index as compared to anatase phase titanium oxide, optical device film layers formed from just rutile phase titanium oxide exhibit decreased optical loss as compared to the optical device film layers formed from multi-phase titanium oxide layers having a mixture of both rutile and anatase phase titanium oxide. A mixture of both rutile and anatase phase titanium oxide in optical device film layers can cause optical interference at the boundaries of the different phases, thereby causing optical loss. In an embodiment, in a comparison of optical loss measurements between optical device layers formed from titanium oxide deposited directly on a substrate and titanium oxide deposited on an orientation liner formed by the method 300 discussed herein, it was observed that the titanium oxide deposited on the orientation liner exhibited as little as 0.03% optical loss of visible range light, whereas the optical device layers formed from directly depositing titanium oxide on a substrate exhibited optical loss of at least 0.07% percent and greater of visible range light.

Although not shown, the method 300 can be continued with additional etch and/or lithography steps to form the optical device 500 shown in FIG. 5 after the deposition of the device layer 408 performed in operation 312.

FIG. 5 is a schematic, cross-sectional view of an optical device 500. The optical device 500 is formed from the optical device layer stack 400. In one embodiment, which can be combined with other embodiments described herein, the optical device 500 is a waveguide combiner, such as an augmented reality waveguide combiner. In another embodiment, which can be combined with other embodiments described herein, the optical device 500 is a flat optical device, such as a metasurface. The optical device 500 includes optical device structures 502 disposed on the substrate 402. The optical device structures 502 are formed from the optical device layer stack 400 such that about 100 percent of the portion of the optical device structures 502 formed from the device layer 408 is of rutile phase titanium oxide. The optical device structures 502 include sub-micron critical dimensions, e.g., nanosized dimensions, corresponding to the widths of the optical device structures 502. The optical device structures 502 may be binary structures (not shown) with sidewalls 504 perpendicular to the substrate 402. The optical device structures 502 may be angled structures with at least one of the sidewalls 504 angled relative the substrate 402. The optical device structures 502 are formed for the optical device layer stack 400 via one or more lithography and/or etch processes.

In summary, an optical device layer stack, an optical device formed from the optical device layer stack, and a method of forming an optical device layer stack are described herein. Please find appendix attached. While the foregoing is directed to examples of the present disclosure, other and further examples of the disclosure may be devised without departing from the basic scope thereof, and the scope thereof is determined by the claims that follow.

What is claimed is:

1. A method of forming an optical device layer stack, comprising:
    depositing a titanium containing layer on a substrate;
    thermally treating the titanium containing layer to form an orientation liner on the substrate; and
    depositing an optical device layer of titanium oxide over the orientation liner, wherein a rutile phase of titanium oxide is about 100 percent of the optical device layer.

2. The method of claim 1, wherein the titanium containing layer is formed of pure titanium or titanium oxide.

3. The method of claim 1, wherein the titanium oxide of the optical device layer is selected from the group consisting of titanium(IV) oxide ($TiO_2$), titanium monoxide (TiO), dititanium trioxide ($Ti_2O_3$), $Ti_3O$, $Ti_2O$, b-$TiO_x$, where x is 0.68 to 0.75, and $Ti_nO_{2n-1}$, where n is 3 to 9.

4. The method of claim 1, wherein thermally treating the titanium containing layer comprises perform a thermal annealing processing process, wherein an annealing temperature is between about 400 degrees Celsius and about 1500 degree Celsius.

5. The method of claim 1, wherein thermally treating the titanium containing layer comprises flowing an annealing gas, wherein the annealing gas is selected from the group consisting of air, $O_2$, $N_2$, Ar, Kr, Xe, $H_2O$, $H_2$, and combinations thereof.

6. The method of claim 1, wherein thermally treating the titanium containing layer comprises perform a thermal annealing processing process for an annealing time between about 1 minute and about 72 hours.

7. The method of claim 1, wherein the deposition used to deposit the titanium containing layer is one of a physical vapor deposition (PVD), chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), electron-beam evaporation, or thermal evaporation process.

8. The method of claim 1, wherein the deposition used to deposit the optical device layer is one of a physical vapor deposition (PVD), chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), electron-beam evaporation, or thermal evaporation process.

9. The method of claim 1, wherein the titanium containing layer comprises a thickness less than about 20 nm.

10. The method of claim 1, wherein the optical device layer comprises a thickness less than about 1000 nm.

11. An optical device layer stack comprising:
    a substrate having a first surface;
    an orientation liner disposed over the first surface of the substrate; and
    an optical device layer disposed over the orientation liner, wherein:
        the orientation liner is formed of a titanium containing material;
        the optical device layer is formed of titanium oxide, the titanium oxide selected from the group consisting of titanium(IV) oxide ($TiO_2$), titanium monoxide (TiO), dititanium trioxide ($Ti_2O_3$), $Ti_3O$, $Ti_2O$, δ-$TiO_x$, where x is 0.68 to 0.75, and $Ti_nO2n-1$, where n is 3 to 9; and
        a rutile phase of the titanium oxide is about 100 percent of the optical device layer.

12. The optical device of claim 11, wherein a crystal orientation of the titanium oxide in the optical device layer is one of (211), (110), (101), (200), (111), (210), (220), (002), (221), (301), (311), (320), (202), (212), (321), (400), or (410).

13. The optical device of claim 11, wherein a crystal orientation of the titanium oxide in the optical device layer is (211).

14. The optical device of claim 11, wherein the orientation liner and the optical device layer are crystalline.

15. The optical device of claim 11, wherein the orientation liner and the optical device layer are polycrystalline.

16. The optical device of claim 11, wherein a crystal orientation of the optical device layer is matched to the orientation liner.

17. The optical device of claim 11, wherein a crystal phase of the optical device layer is matched to the orientation liner.

18. The optical device of claim 11, wherein an optical loss of visible range light transmitted through the optical device layer is about 0.03%.

19. An optical device comprising:

a substrate having a first surface;

a plurality of optical device structures disposed over the first surface of the substrate, the plurality of optical device structures spaced apart from each other in a direction parallel to the first surface, wherein each optical device structure of the plurality of optical device structures is formed from an orientation liner and an optical device layer disposed on the substrate, the orientation liner is formed of a titanium containing material;

the optical device layer is formed of titanium oxide;

the titanium oxide in the optical device layer is selected from the group consisting of titanium(IV) oxide ($TiO_2$), titanium monoxide (TiO), dititanium trioxide ($Ti_2O_3$), $Ti_3O$, $Ti_2O$, b-$TiO_x$, where x is 0.68 to 0.75, and $Ti_nO_{2n-1}$, where n is 3 to 9; and a rutile phase of the titanium oxide is about 100 percent of the optical device layer.

20. The optical device of claim 19, wherein an optical loss of visible range light transmitted through the plurality of optical device structures is about 0.03%.

\*   \*   \*   \*   \*